United States Patent
Afzal et al.

(10) Patent No.: US 12,169,786 B1
(45) Date of Patent: Dec. 17, 2024

(54) NEURAL NETWORK ACCELERATOR WITH RECONFIGURABLE MEMORY

(71) Applicant: Amazon Technologies, Inc., Seattle, WA (US)

(72) Inventors: Tariq Afzal, San Jose, CA (US); Arvind Mandhani, San Francisco, CA (US); Shiva Navab, Mountain View, CA (US)

(73) Assignee: Amazon Technologies, Inc., Seattle, WA (US)

( * ) Notice: Subject to any disclaimer, the term of this patent is extended or adjusted under 35 U.S.C. 154(b) by 1264 days.

(21) Appl. No.: 16/455,334

(22) Filed: Jun. 27, 2019

Related U.S. Application Data

(60) Provisional application No. 62/772,359, filed on Nov. 28, 2018.

(51) Int. Cl.
*G06N 3/10* (2006.01)
*G06N 3/02* (2006.01)
*G06N 3/08* (2023.01)

(52) U.S. Cl.
CPC ............... *G06N 3/10* (2013.01); *G06N 3/08* (2013.01); *G06N 3/02* (2013.01)

(58) Field of Classification Search
CPC ............... G06N 3/10; G06N 3/08; G06N 3/02
See application file for complete search history.

(56) References Cited

U.S. PATENT DOCUMENTS

| | | | |
|---|---|---|---|
| 7,389,407 B1 | 6/2008 | Kuslak et al. | |
| 9,836,691 B1 | 12/2017 | Narayanaswami et al. | |
| 10,585,973 B2 | 3/2020 | Tao et al. | |
| 10,643,129 B2 | 5/2020 | Chen et al. | |
| 10,659,534 B1* | 5/2020 | McKown | G06F 3/0613 |
| 2002/0073301 A1 | 6/2002 | Kahle et al. | |
| 2009/0259826 A1 | 10/2009 | Moore | |
| 2014/0173261 A1 | 6/2014 | Garza et al. | |
| 2015/0052339 A1 | 2/2015 | Suzuki | |

(Continued)

OTHER PUBLICATIONS

Lin, Yue-Jin, and Tian Sheuan Chang. "Data and hardware efficient design for convolutional neural network." IEEE Transactions on Circuits and Systems I: Regular Papers 65.5 (2017): 1642-1651. (Year: 2017).*

(Continued)

*Primary Examiner* — Li B. Zhen
*Assistant Examiner* — Henry Nguyen
(74) *Attorney, Agent, or Firm* — Kilpatrick Townsend & Stockton LLP

(57) ABSTRACT

Described herein is a neural network accelerator (NNA) with reconfigurable memory resources for forming a set of local memory buffers comprising at least one activation buffer, at least one weight buffer, and at least one output buffer. The NNA supports a plurality of predefined memory configurations that are optimized for maximizing throughput and reducing overall power consumption in different types of neural networks. The memory configurations differ with respect to at least one of a total amount of activation, weight, or output buffer memory, or a total number of activation, weight, or output buffers. Depending on which type of neural network is being executed and the memory behavior of the specific neural network, a memory configuration can be selected accordingly.

20 Claims, 7 Drawing Sheets

(56) References Cited

U.S. PATENT DOCUMENTS

| | | | |
|---|---|---|---|
| 2016/0041851 | A1 | 2/2016 | Bauerle et al. |
| 2017/0270996 | A1* | 9/2017 | Takasugi ............. G11C 11/4096 |
| 2018/0046900 | A1* | 2/2018 | Dally .................... G06F 9/3001 |
| 2018/0113708 | A1 | 4/2018 | Corbal et al. |
| 2018/0129935 | A1* | 5/2018 | Kim ...................... G06F 17/153 |
| 2018/0143835 | A1 | 5/2018 | Whittaker |
| 2018/0225116 | A1 | 8/2018 | Henry et al. |
| 2018/0307976 | A1 | 10/2018 | Fang et al. |
| 2018/0315399 | A1 | 11/2018 | Kaul et al. |
| 2018/0341484 | A1 | 11/2018 | Fowers et al. |
| 2019/0026250 | A1 | 1/2019 | Das Sarma et al. |
| 2019/0065192 | A1 | 2/2019 | Tao et al. |
| 2019/0250915 | A1 | 8/2019 | Yadavalli |
| 2019/0303749 | A1 | 10/2019 | Appuswamy et al. |
| 2020/0042859 | A1* | 2/2020 | Mappouras ............ G06N 3/084 |
| 2020/0050918 | A1 | 2/2020 | Chen et al. |
| 2020/0134459 | A1* | 4/2020 | Zeng ........................ B60R 1/00 |
| 2020/0160222 | A1 | 5/2020 | Zhang et al. |
| 2020/0257930 | A1* | 8/2020 | Nahr ...................... G06V 10/82 |
| 2021/0150685 | A1 | 5/2021 | Chen et al. |

OTHER PUBLICATIONS

Hwang, Wen-Jyi, Yun-Jie Jhang, and Tsung-Ming Tai. "An efficient FPGA-based architecture for convolutional neural networks." 2017 40th International Conference on Telecommunications and Signal Processing (TSP). IEEE, 2017. (Year: 2017).*

Zhang C, Sun G, Fang Z, Zhou P, Pan P, Cong J. Caffeine: Toward uniformed representation and acceleration for deep convolutional neural networks. IEEE Transactions on Computer-Aided Design of Integrated Circuits and Systems. Oct. 18, 2018;38(11):2072-85. (Year: 2018).*

Gong L, Wang C, Li X, Chen H, Zhou X. MALOC: A fully pipelined FPGA accelerator for convolutional neural networks with all layers mapped on chip. IEEE Transactions on Computer-Aided Design of Integrated Circuits and Systems. Jul. 18, 2018;37(11):2601-12. (Year: 2018).*

Hanif MA, Putra RV, Tanvir M, Hafiz R, Rehman S, Shafique M. MPNA: A massively-parallel neural array accelerator with dataflow optimization for convolutional neural networks. arXiv preprint arXiv:1810.12910. Oct. 30, 2018. (Year: 2018).*

U.S. Appl. No. 16/455,258, "Decompression and Compression of Neural Network Data Using Different Compression Schemes," filed Jun. 27, 2019.

U.S. Appl. No. 16/455,551, "Neural Network Accelerator With Compact Instruct Set," filed Jun. 27, 2019.

U.S. Appl. No. 16/455,551, Non-Final Office Action, Mailed on Mar. 1, 2021, 33 pages.

Chen et al., "A Flexible and Energy-Efficient Convolutional Neural Network Acceleration With Dedicated ISA and Accelerator", In IEEE Transactions on Very Large Scale Integration (VLSI) Systems, vol. 26, No. 7, Jul. 2018, pp. 1408-1412.

Liu et al., "Cambricon: An Instruction Set Architecture for Neural Networks", 2016 ACM/IEEE 43rd Annual International Symposium on Computer Architecture (ISCA), Jun. 2016, pp. 393-405.

U.S. Appl. No. 16/455,381, "Silent Phonemes for Tracking End of Speech," filed Jun. 27, 2019.

U.S. Appl. No. 16/455,400, "Hybrid Decoding Using Hardware and Software for Automatic Speech Recognition Systems," filed Jun. 27, 2019.

U.S. Appl. No. 16/455,551, Final Office Action, Mailed on Jul. 6, 2021, 24 pages.

* cited by examiner

NEURAL NETWORK ACCELERATOR WITH RECONFIGURABLE MEMORY

CROSS-REFERENCES TO RELATED APPLICATIONS

This application claims the benefit of and priority to U.S. Provisional Application No. 62/772,359 filed Nov. 28, 2018, entitled "ACE Architecture—NNA." The contents of U.S. Provisional Application No. 62/772,359 are incorporated herein in their entirety for all purposes. The entire contents of the following applications, filed concurrently with the present application, are also incorporated herein by reference for all purposes:

(1) U.S. Non-Provisional application Ser. No. 16/455,258, filed Jun. 27, 2019, titled "DECOMPRESSION AND COMPRESSION OF NEURAL NETWORK DATA USING DIFFERENT COMPRESSION SCHEMES"; and
(2) U.S. Non-Provisional application Ser. No. 16/455,551, filed Jun. 27, 2019, titled "NEURAL NETWORK ACCELERATOR WITH COMPACT INSTRUCT SET".

BACKGROUND

Computer processors perform various operations on data, including arithmetic operations such as addition, multiplication, and division, and data move operations such as load or store. General purpose processors, such as the central processing unit (CPU) in modern computers, are not specifically designed for certain tasks. For example, the limitations of general purpose processors with respect to graphics computations led to the development of specialized graphics processing units (GPUs).

Neural networks are currently being developed for a wide variety of applications such as image or speech recognition. Neural networks can be executed on general purpose processors using program code written in a specialized programming language such as TensorFlow. The program code is converted into machine instructions by a compiler. In a neural network, the types of computations performed, and the data the computations are performed on, are very different from that used for other applications. For example, neural networks generally involve repeated manipulation of large quantities of data in the form of activation values (corresponding to input activations to a particular layer of a neural network) and weight values. Typically, the memory for storing input activations, weights and outputs (corresponding to output activations of the neural network) is a monolithic memory with no restrictions on which memory units can be used for activations, weights, or outputs. No memory locations are predefined for storing input activations, weights or output activations. Further, any client of the memory can read or write to any location in the memory. This creates access conflicts that reduce the overall throughput of the computing system executing the neural network. Additionally, the logic for arbitration and conflict resolution between requests from different clients to the same memory unit tends to be complex. This increases the size and power consumption of the computing system.

BRIEF DESCRIPTION OF THE DRAWINGS

Various embodiments in accordance with the present disclosure will be described with reference to the drawings, in which.

DETAILED DESCRIPTION

Figure 1:
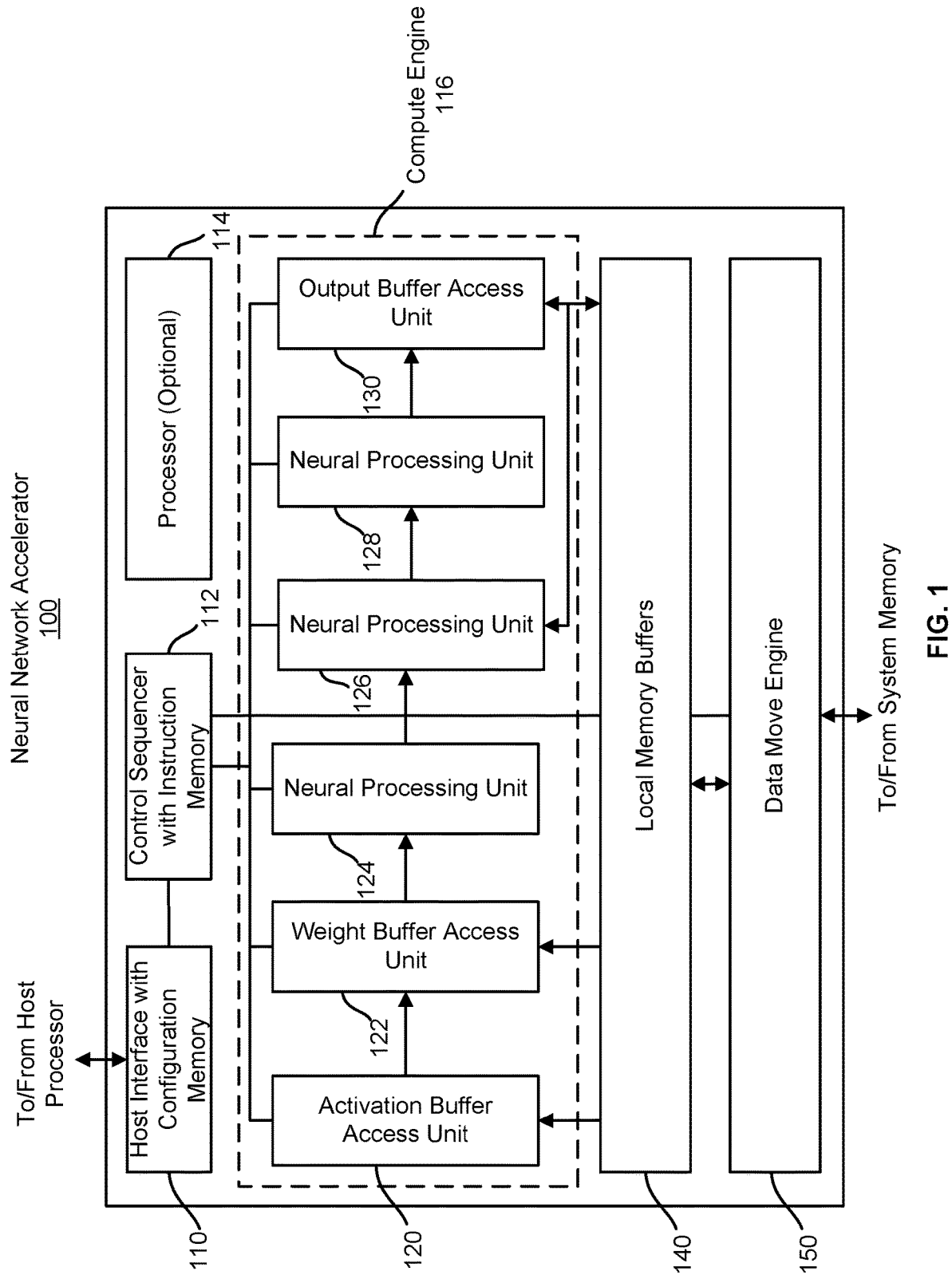
FIG. 1 is a block diagram of an example neural network accelerator, according to certain embodiments.

Embodiments are described herein for a neural network processor, also referred to as a neural network accelerator (NNA), in which the neural network processor has a reconfigurable memory for storing weights, activations, and outputs of computations performed using the weights and activations. The reconfigurable memory is configurable into one of a set of predefined memory configurations in which, for each memory configuration, there is at least one activation buffer, at least one weight buffer, and at least one output buffer. The total number and size of each of type of memory buffer vary depending on the memory configuration.

In certain embodiments, the memory configuration is selected based on the type of neural network being executed. Different types of neural networks have different data requirements. For example, convolutional neural networks (CNNs) tend to require fewer weights compared to fully connected or recurrent neural networks. Accordingly, a memory configuration having fewer and/or smaller weight buffers can be selected when a CNN is to be executed. Other data usage characteristics may also impact the decision on which memory configuration to use. For example, the total number of times data is reused and the frequency of usage of a particular type of data can be taken into consideration. These data usage characteristics are not necessarily entirely dependent on the type of neural network, but may also depend on the memory usage behavior of the specific neural network to be executed.

In the conventional monolithic memory approach described earlier, the memory is usually made larger than necessary in order to reduce conflicts between accesses to the same memory location. Simultaneous access requests to the same memory location are handled through dynamic arbitration. For example, if three clients want to access the same bank of memory, access can only be given to one of the three clients, with the other two clients being stalled until the first client completes its access. This reduces throughput as the other two client have to wait to continue processing. In contrast to the monolithic memory approach, by restricting the memory to a set of predefined memory configurations, conflicts can be avoided without requiring arbitration. In particular, each memory configuration determines which memory locations are allocated for use as activation buffer memory, weight buffer memory, or output buffer memory. Competing access requests from different entities are avoided by restricting each memory location to a specific type of use. Thus, an activation buffer can be dedicated to storing input activations, a weight buffer dedicated to storing weights, and an output buffer dedicated to storing output activations.

In the description herein, various embodiments are described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiments being described.

Neural Network Accelerator Overview

Neural networks are modeled using one or more layers. In a simple neural network, there may be an input layer followed by a hidden layer and then an output layer. A neural network implementation can include multiple hidden layers. Each layer comprises some number of nodes, where each node represents a neuron. A node can be connected to one or more nodes of another layer. The connections represent synapses and are assigned weights. The input layer may receive inputs to the neural network and propagate the inputs to the hidden layer, which in turn performs some computation to propagate the results of the computation to the output layer. The computations are performed by nodes. The input to a node in a hidden or output layer is referred to as an input activation. The output of a node in a hidden or output layer is referred to as an output activation. The output activations of the output layer produce the final results of the neural network and correspond to inferences concerning the inputs supplied to the input layer. An example of a computation that can occur in a node is as follows:

$$y = f\left(\sum_i w_i * x + iv\right)$$

where $w_i$ is a weight, x is an input activation, iv is an initial/bias value, and f is an activation function (e.g., a nonlinear function such as sigmoid or hyperbolic tangent). The example computation above involves computing a weighted sum of input activations multiplied by weights, adding the bias/initial value iv to the weighted sum, and then applying the activation function $f$. The activation function determines the behavior of the output value of the node as a function of the parenthetical term, and may be configured to constrain the output value to a range (e.g., from −1 to +1). Nonlinear functions map the output values onto a shape that is nonlinear, i.e., not a straight line. It is understood, however, that nonlinear functions can provide for an output value range in which at least some portions are linear. For example, rectified linear unit (ReLU) is shaped like two lines that are connected, but with different slope. The weights are typically represented as a vector, where each element of the vector is a weight value. Similarly, the input activations can also be represented as a vector so that the multiplication of the weights with their corresponding input activations is expressed as a dot product. Generally, weights are determined based on training that occurs prior to executing the neural network on actual input, i.e., offline. During training, a set of training inputs are processed through the neural network to adjust the weights based on the results (e.g., inferences) generated using the training inputs.

FIG. 1 is a simplified block diagram of an NNA 100 according to certain embodiments. The NNA 100 comprises a host interface 110, a control sequencer 112, an optional processor 114, an activation buffer access unit 120, a weight buffer access unit 122, a plurality of neural processing units (NPUs) 124, 126, and 128, an output buffer access unit 130, a set of local memory buffers 140, and a data move engine (DME) 150. The activation buffer access unit 120, the weight buffer access unit 122, the NPUs 124, 126, and 128, and the output buffer access unit 130 collectively form a compute engine 116. Along with the control sequencer 112 and the DME 150, the compute engine 116 is responsible for executing instructions. The NNA 100 can be implemented as a standalone computing system or, as shown in FIG. 1, as part of a computing system comprising a host processor and system memory.

The NNA 100 depicted in FIG. 1 is merely an example and is not intended to unduly limit the scope of claimed embodiments. One of ordinary skill in the art would recognize many possible variations, alternatives, and modifications. For example, in some implementations, NNA 100 may have more or fewer components than those shown in FIG. 1, may combine two or more components, or may have a different configuration or arrangement of components.

The NNA 100 generally executes one set of instructions at a time. This set of instructions is referred to herein as a "context." At runtime, the NNA 100 sequences and dispatches, using control sequencer 112, instructions from a pre-compiled context for execution. In certain embodiments, each context comprises a set of instructions that ends with a HALT instruction. Contexts are created by a software compiler. The instructions within a context can implement at least part of a neural network. For example, a context can correspond to a complete layer, a partial layer, or multiple layers of the neural network. In some instances, a context can correspond to a complete neural network (e.g., with instructions for an input layer, a hidden layer, and an output layer).

The host interface 110 is a communication interface to the host processor (not depicted) of the local computing system. The NNA 100 may be communicatively coupled to multiple hosts simultaneously, with any one of the hosts being able to program the NNA 100 to execute neural network-related tasks on behalf of the host. The host interface 110 can communicate with the host processor via a standard communication protocol such as, for example, Advanced extensible Interface (AXI) protocol. Similarly, the NNA 100 can include a separate communication interface for communicating with the system memory, e.g., to read and write data from the local memory buffers 140 to the system memory. The communication interface to the system memory is, in certain embodiments, integrated into the DME 150. Thus, the DME 150 can also include an AXI interface.

The control sequencer 112 is responsible for sequencing, dispatching and finishing execution of instructions. Some instructions are executed entirely in the control sequencer 112. Other instructions may be dispatched to one or more of the NPUs 124, 126, and 128 for execution, possibly with execution results being returned to the control sequencer 112 for further processing. Still other instructions are executed by the DME 150 to move data to and from the local memory buffers 140. More than one instruction can be in the execution phase at any given time within the NNA 100. The control sequencer 112 can include an instruction memory into which instructions to be executed by the NNA 100 are downloaded from the host processor or loaded from the system memory.

Figure 4:
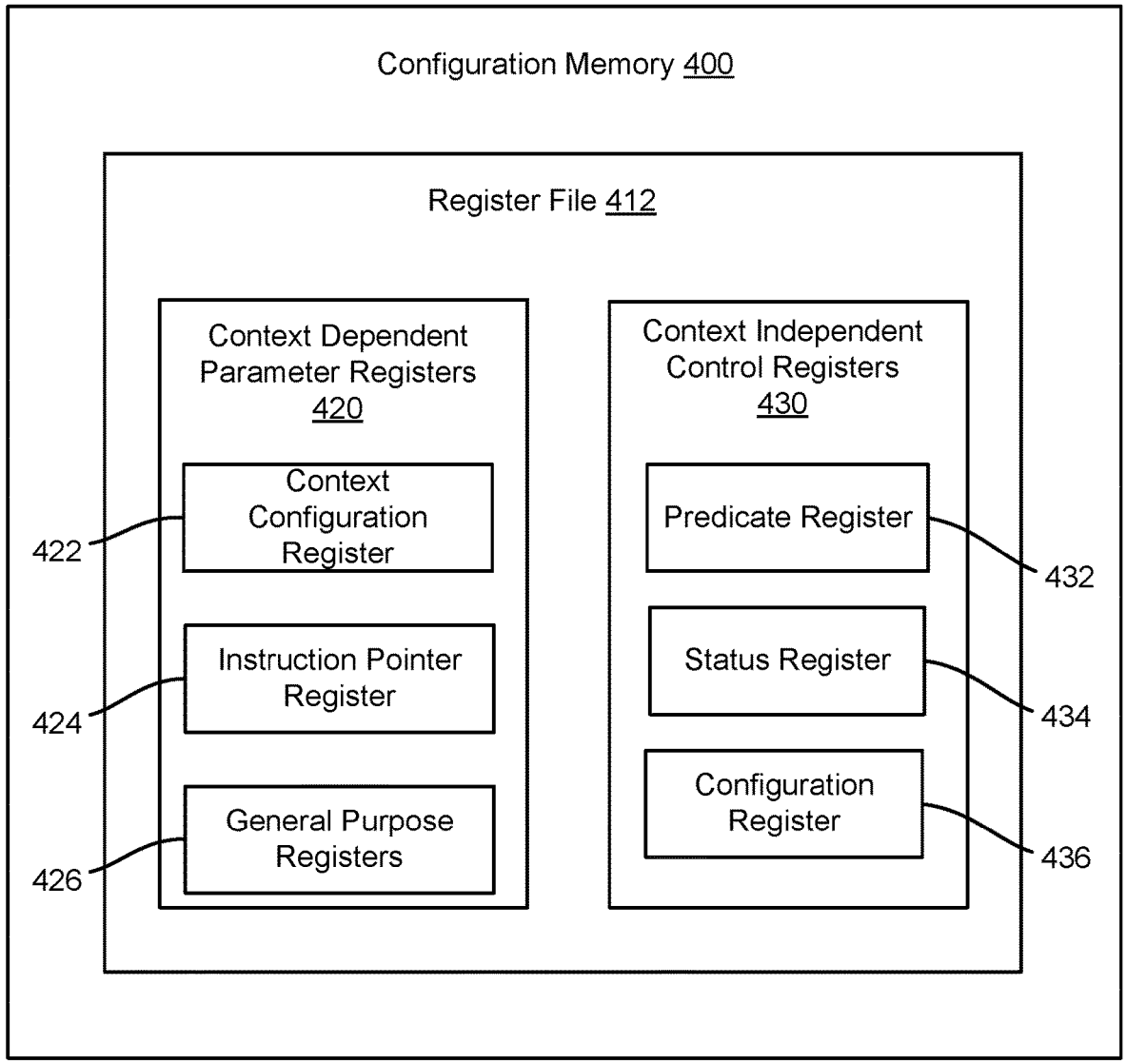
FIG. 4 illustrates an example of a configuration memory within a neural network accelerator, according to certain embodiments.

In the example of FIG. 1, the host interface 110 includes a configuration memory. The configuration memory may include one or more registers that are configurable by the host processor to specify parameters relating to the context to be executed, e.g., various context dependent parameter registers (CDPRs). An example of a configuration memory is shown in FIG. 4.

In certain embodiments, the configuration memory includes a predicate register for synchronizing execution of instructions. Instructions are broadcast by the control sequencer 112 to each component of the compute engine 116 as well as the local memory buffers 140 and the DME 150. Upon receipt of a broadcast instruction, a component may proceed to execute at least part of the instruction in response to determining that the component is capable of handling the instruction. For example, the DME 150 could receive and execute a data move instruction, but the NPUs 124, 126, and 128 could ignore the data move instruction. Because instructions can execute concurrently in different components, it is useful to have a synchronization mechanism to handle any dependencies between instructions. The predicate register can be used to implement such a synchronization mechanism and, in certain embodiments, is a global register visible to internal components of the NNA 100, as well as visible to external entities such as the host processor. Synchronization also helps to prevent conflicts in accessing the local memory buffers 140.

The processor 114 is an optional general purpose processor for performing certain types of processing in parallel with processing performed by the NPUs 124, 126, and 128. For example, processor 114 may include a floating point unit or other arithmetic logic unit for performing general arithmetic operations in parallel with matrix operations performed by the NPUs 124, 126, and 128.

The activation buffer access unit 120 is configured to access one or more activation buffers in the local memory buffers 140. Similarly, the weight buffer access unit 122 and the output buffer access unit 130 are configured to access one or more weight buffers and one or more output buffers, respectively. The activations stored in the activation buffer(s) correspond to activations produced by one or more layers of a neural network being executed on the NNA 100. The weights stored in the weight buffer(s) are synaptic weights associated with edges between a node of one layer and a node of another layer. Activation and weights are used for certain computations, including for instructions executed by the compute engine 116. The output buffers can store final results or intermediate results (e.g., partial sums) for access by the host processor or the system memory.

The DME 150 is used to bidirectionally move instructions and data between the system memory and NNA local memories (e.g., the activation, the weight, and output buffers that form the local memory buffers 140. The DME 150 can receive data move instructions (e.g., LOAD and STORE instructions) from the control sequencer 112 when such instructions are broadcast. The data move instructions executed by DME 150 can execute concurrently with compute instructions executed by the control sequencer 112 or the compute engine 116.

Figure 3:
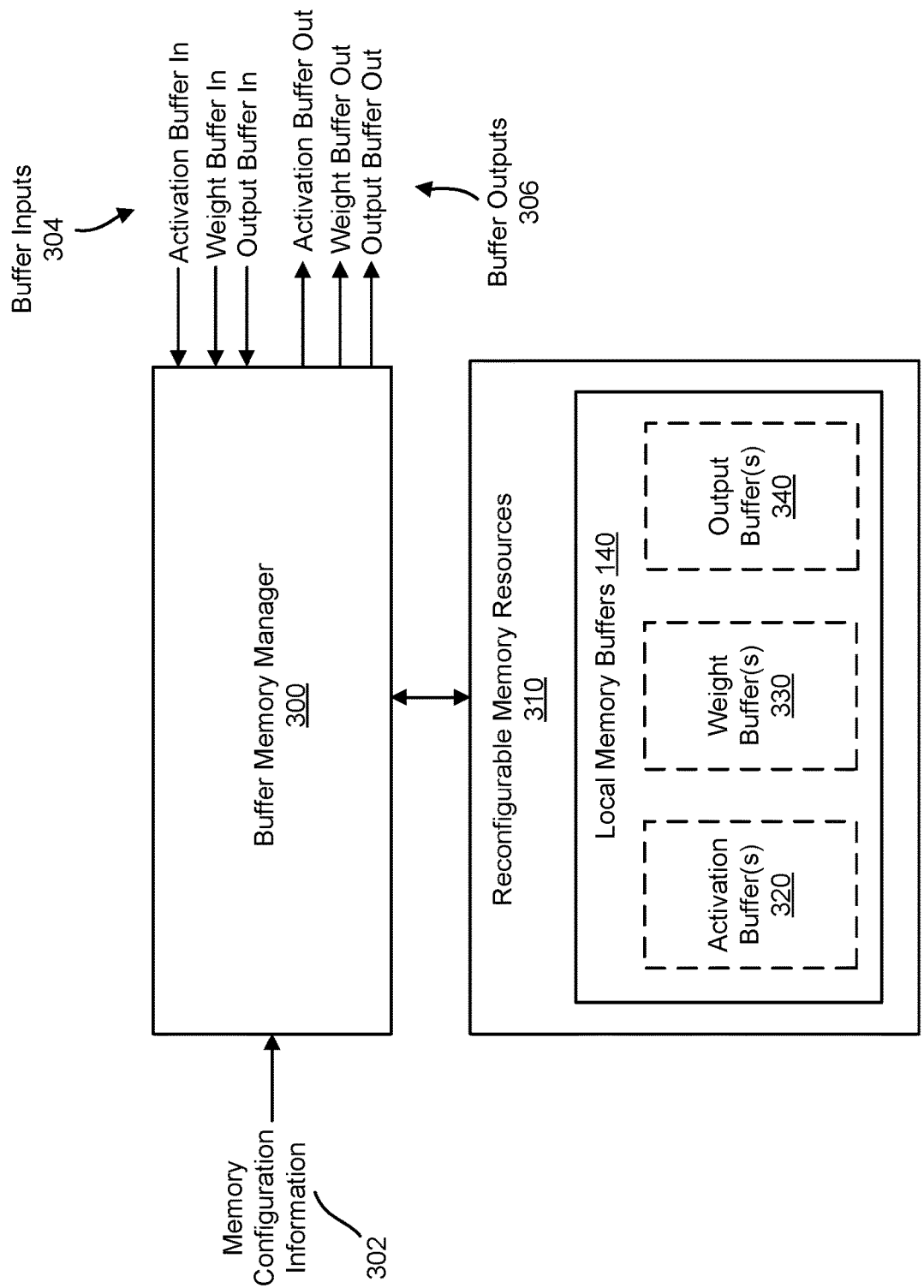
FIG. 3 illustrates an example buffer memory manager for reconfiguring memory resources, according to certain embodiments.

The local memory buffers 140 are reconfigurable memory resources that can be reconfigured using a buffer memory manager, as shown in FIG. 3. Local memory buffers 140 are used to abstract the physical implementation of memories that form the activation, weight, and output buffers from NNA components (e.g., the compute engine 116 and the DME 150) that access data in these buffers. The data in the activation, weight, and output buffers is accessed through addressing the buffers individually, with the buffer addresses being mapped to the physical addresses of the memories where the data is stored. In certain embodiments, the memories of the local memory buffers 140 are implemented as static random-access memory (SRAM) devices. However, the local memory buffers 140 can be implemented using other types of memory, both volatile and non-volatile (e.g., flash memory, DRAM, resistive RAMs, and the like).

The NPUs 124, 126, and 128 perform numerical operations using the activations and weights stored in the local memory buffers 140. Each NPU is configured to perform all or part of a compute instruction. Although FIG. 1 depicts the NPUs 124, 126, and 128 as block components, the NPUs 124, 126, and 128 are not necessarily identical. For example, as described in connection with FIG. 2, the operations of one NPU may differ from the operations performed by another NPU.

Figure 2:
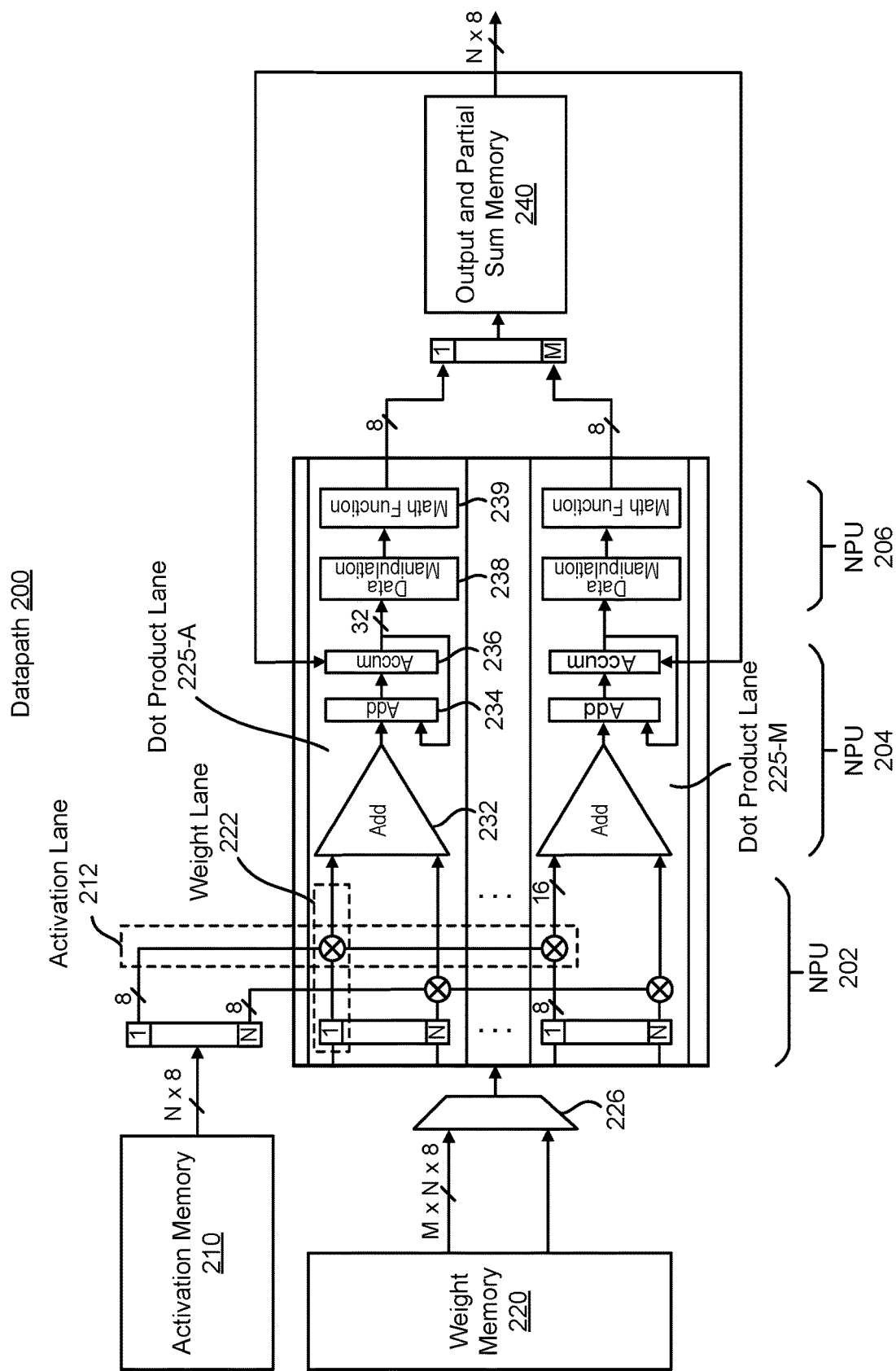
FIG. 2 shows an example datapath for operations performed within a compute engine of a neural network accelerator, according to certain embodiments.

FIG. 2 shows an example datapath 200 for operations performed within a compute engine, e.g., the compute engine 116. As shown in FIG. 2, a plurality of NPUs 202, 204, and 206 are communicatively coupled to an activation memory 210 and a weight memory 220. The NPUs 202, 204, and 206 are coupled together to form a processing pipeline, and can correspond to the NPUs 124, 126, and 128, respectively. The activation memory 210 and the weight memory 220 may correspond to the activation buffers and the weight buffers in the local memory buffers 140, respectively. In the example of FIG. 2, the processing performed by each NPU 202, 204, and 206 involves M dot product lanes 225 of N inputs each. Two dot product lanes 225-A and 225-N are shown. In FIG. 2, the activations are 8-bit data values, N activations in total being read out of the activation memory 210 to all M dot product lanes 225. Similarly, the weights can be 8-bit data values, N weights per dot product lane 225, for a total of M×N×8 bits of weight data that are read out of the weight memory 220 into a multiplexer 226 for distribution to the dot product lanes 225, with a different set of N weights being supplied to each dot product lane 225. However, in other implementations, the activations and the weights could be represented using a different number of bits. Further, the number of bits used to represent an activation are not necessarily always equal to the number of bits used to represent a weight.

Each dot product lane 225 computes N number of dot products between a weight value and an activation value, with the results being summed by an adder 232 for input to an adder 234. The adder 234 computes a running total for input to an accumulator 236, using the current value of the accumulator 236 and the output of the adder 232. As shown in FIG. 2, the NPU 202 can handle computation of the dot products, and the NPU 204 can handle the summation and accumulation.

The accumulator 236 stores intermediate results generated by the adder 234. Intermediate results are often accumulated in the layers of certain types of neural networks, such as fully connected and convolutional layers. To avoid overflow, the accumulator 236 can be implemented with a higher bit width compared to the weights and activations, e.g., 32-bit.

Once the accumulator 236 has completed an accumulation sequence, the result stored in the accumulator 236 can be written to an output and partial sum memory 240 (e.g., an output buffer in the local memory buffers 140) after processing through a data manipulation block 238 that can optionally down shift the output of the accumulator 236, e.g., to an 8-bit value using a quantization algorithm. The data manipulation block 238 can also perform other data manipulations such as applying clipping and/or a scale factor. The output of the data manipulation block 238 is then sent to a math function block 239 that applies an activation function, which can be a nonlinear function (e.g., rectified linear unit (ReLU), hyperbolic tangent (Tan h), or sigmoid). The data manipulation block 238 and the math function block can be implemented by the NPU 206. The outputs of all M math function blocks are then combined into a single vector for transmission to output and partial sum memory 240. The output and partial sum memory 240 may store either output activations (which can be read back into the activation memory 210 for input to a subsequent computation by the same or a different neural network layer) or partial sums that are accumulated. Output activations can, in some embodiments, be transferred directly from the output and partial sum memory 240 into the activation memory 210. Alternatively, the output activations can be temporarily transferred to system memory before loading the output activations into the activation memory 210.

FIG. 3 illustrates an example buffer memory manager 300 for controlling reconfigurable memory resources 310, according to certain embodiments. As mentioned earlier, the local memory buffers 140 are used to abstract the physical implementation of memories that form the activation, weight, and output buffers from NNA components that access data in these buffers. This abstraction can performed with the aid of the buffer memory manager 300. For example, in some embodiments, each activation buffer, weight buffer, and output buffer may be assigned its own address space (e.g., beginning from address zero), and the physical addresses of the memory devices which form the local memory buffers 140 may be hidden by the buffer memory manager 300. Thus, the activation buffer access unit 120, the weight buffer access unit 122, the output buffer access unit 130, and any other NNA components that access the local memory buffers (e.g., the DME 150) may not be aware of where data is physically stored in the local memory buffers. This enables the local memory buffers to be reconfigured without imposing upon the clients of the local memory buffers the burden of tracking the physical addresses.

The buffer memory manager 300 receives memory control information 302 and routes buffer inputs 304 and buffer outputs 306 based on the memory control information 302. The routing performed by buffer memory manager 300 forms the local memory buffers 140 without having to physically reconfigure a set of memory devices (e.g., a plurality of SRAM banks). Input directed to activation buffers 320 is routed to memory devices that are selectively assigned to the activation buffers 320. Similarly, output from the memory devices assigned to the activation buffers 320 is routed to form output of the activation buffers 320. The routing for weight buffers 330 and output buffers 340 is performed in a similar fashion. In some implementations, the types of data which a memory device can store are restricted. For example, certain SRAM banks may only be available for use as activation or weight buffer memory, but not output buffer memory.

Although FIG. 3 shows the buffer memory manager 300 as a single block, the buffer memory manager can be implemented as distributed control logic. In certain embodiments, the memory control information 302 is obtained from the contents of a context configuration register 422 (shown in FIG. 4) and the buffer memory manager 300 comprises an arrangement of multiplexers that perform the routing of the buffer inputs and outputs. For example, the memory control information 302 may correspond to the value of a 2-bit memory configuration field in the context configuration register 422. This 2-bit value can be read out of the context configuration register 422 and into the buffer memory manager 300 for use as a multiplexer selection signal. FIG. 4 is a simplified block diagram of a configuration memory 400, according to certain embodiments. The configuration memory 400 can be used to implement the configuration memory in FIG. 1, which is part of the host interface 110. However, in other embodiments, the configuration memory 400 or portions thereof can reside elsewhere. The configuration memory 400 comprises a register file 412.

In certain embodiments, the register file 412 is a user register file comprising registers that are accessible (readable and/or writeable) to a host. The register file 412 may comprise context dependent parameter registers (CDPRs) 420 and context independent control registers (CICR) 430. CDPRs 420 can include a context configuration register 422, an instruction pointer register 424, and a set of general purpose registers 426.

Context configuration register 422 is a register that stores context-specific configuration information. The context configuration register 422 can store information indicating which memory configuration to use. In certain embodiments, this information is stored in the form of a 2-bit value that indicates a particular memory configuration from a set of three or four predefined memory configurations. However, the number of memory configuration that are available, and therefore the size of the memory configuration information stored in the context configuration register 422, can vary depending on the implementation.

Instruction pointer register 424 stores a pointer to an address where the next instruction to be executed resides. The pointer can be to a local memory (e.g., an address in the instruction memory) or an external memory (e.g., an address in the system memory).

General purpose registers (GPRs) 426 are registers available for general use during execution of instructions.

CICRs 430 can include a predicate register 432, a status register 434, and a configuration register 436. The function of predicate registers was described earlier in connection with FIG. 1. In certain embodiments, the predicate register 423 may be part of the control sequencer 112.

The status register 434 can be a read-only register (from the perspective of the host processor) containing information on the status of the NNA 100. The contents of the status register 434 are cleared at the beginning of starting a context and can include various types of status information such as error codes, a pointer to the address of an instruction that caused an error, information on whether the data move engine 150 or any of the local memory buffers are busy, and so on.

The configuration register 436 contains settings that determine various operating modes and configurations for the NNA 100. For example, configuration register 436 can be used to specify whether program code is to be downloaded from a host or loaded from system memory, enable a debugging bus, and enable decompression of input data.

Example Memory Configurations

Figure 5A:
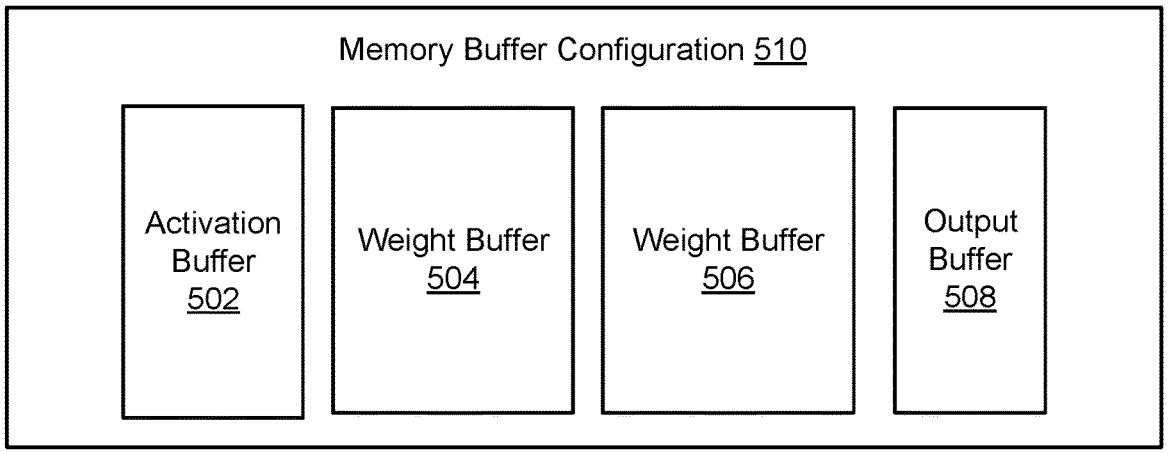
FIGS. 5A-5C illustrate example memory buffer configurations for a neural network accelerator, according to certain embodiments.
Figure 5B:
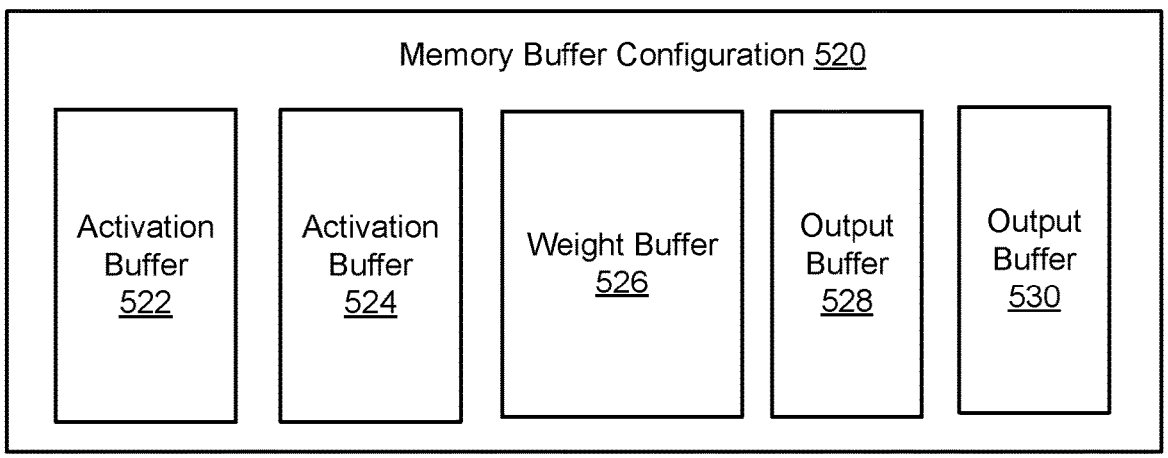
Figure 5C:
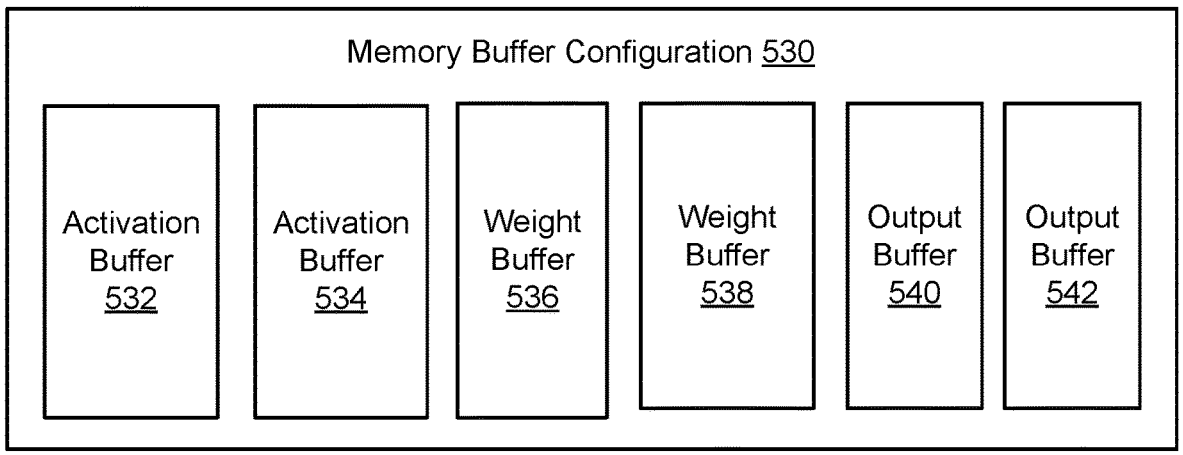

FIGS. 5A-5C show example memory buffer configurations 510, 520, and 530 into which the local memory buffers 140 can be reconfigured. Each memory buffer configuration can be assigned a corresponding value in a field of the context configuration register 422 in FIG. 4. For example, setting the field to a value of 0 may select the memory buffer configuration 510, setting the field to a value of 1 may select the memory buffer configuration 520, and so on. Each memory buffer configuration is designed to maximize throughput for a given neural network configuration, taking into consideration factors that influence the memory behavior of the neural network such as the type of neural network and a batch parameter indicating how many input data samples will be processed through the neural network. FIGS. 5A-5C are merely examples of possible memory buffer configurations. Other memory buffer configurations can also be used, including a configuration in which there is no weight buffer.

In addition to configuring the total number of each type of buffer, the sizes of the buffers can also be configured. For example, the configurations 510, 520, and 530 may be implemented as shown in the following table, using Config 0, Config 1, and Config 2, respectively.

TABLE 1

|  | Act Buf 0 | Act Buf 1 | Out Buf 0 | Out Buf 1 | Syn Buf 0 | Syn Buf 1 |
| --- | --- | --- | --- | --- | --- | --- |
| Config 0 | 4 KB | None | 4 KB | None | 32 KB | 32 KB |
| Config 1 | 16 KB | 16 KB | 4 KB | 4 KB | 32 KB | None |
| Config 2 | 16 KB | 16 KB | 4 KB | 4 KB | 16 KB | 16 KB |

FIG. 5A shows the memory buffer configuration 510. The configuration 510 is designed for fully connected or recurrent neural networks. In configuration 510, there is one activation buffer 502, two weight buffers 504 and 506, and one output buffer 508. In fully connected and recurrent neural networks, there tends to be a greater usage of weights. Accordingly, configuration 510 features more weight buffers than activation or output buffers. Here, the weight buffers 504 and 506 may operate as ping-pong buffers that enable weight data to be written into one of the weight buffers 504 and 506 (e.g., by DME 150) at the same time that data is being read out of the other of the weight buffers 504 and 506 (e.g., writing weights to weight buffer 504 by DME 150 in parallel with reading of weights from weight buffer 506 by weight buffer access unit 122 for use by one or more NPUs).

FIG. 5B shows the memory buffer configuration 520. Like the configuration 510, the configuration 520 is designed for fully connected or recurrent neural networks. In configuration 520, there are two activation buffers 522 and 524, one weight buffer 526, and two output buffers 528 and 530. Unlike configuration 510, the configuration 520 does not feature ping-pong weight buffers and is suited for fully connected or recurrent neural networks that use more activations. The configuration 520 also features ping-pong activation and output buffers.

FIG. 5C shows the memory buffer configuration 530. The configuration 530 is designed for CNNs. In configuration 530, there are two activation buffers 532 and 534, two weight buffers 536 and 538, and two output buffers 540 and 542. CNNs tend to have lower weight memory requirements and higher activation memory requirements since the same set of weights are typically reused for different batches of input data, whereas different weights are used for each batch of input data in fully connected and recurrent neural networks. Thus, in the table above, the total size of the weight buffers in Config 2 is the same as in Config 1 (which, as explained above, is more activation focused and less weight focused), but the weight buffers are split into two ping-pong buffers for faster access.

From the examples in FIGS. 5A-5C and the table above, it will be apparent that the total number of each buffer type, the size of each individual buffer, as well as the total amount of memory for any particular buffer type, can vary depending on the overall memory requirements for any given type of data as well as the frequency with which the data is expected to be accessed. In the example table above, the same 72 kilobyte (KB) pool of reconfigurable memory is fully allocated amongst the activation, weight, and output buffers. In general, there is a relationship between the sizes of different types of buffers. For example, the amount of weight memory needed may depend on the amount of activation memory used. Thus, once the size of one type of buffer is determined, the sizes of the other types of buffers can be determined accordingly. Regarding the number of buffers, less frequently used buffers can be reduced in number to free up memory for increasing the number of more frequently used buffers. For example, reducing the number of weight buffers in configuration 510 may result in an increase in the number of activation and/or output buffers, as in configuration 520. The memory configurations described above are merely examples. Other memory configurations can be defined depending on what types of neural networks the NNA is expected to execute and the memory usage behavior of those neural networks.

Determining Memory Configurations

The total number of memory buffer configurations supported by an NNA can vary depending on what neural networks the NNA is expected to execute. Each memory buffer configuration can be configured based on the memory usage behavior of a particular neural network to be executed on the NNA. The following are some examples that illustrate how a memory configuration can be determined for an NNA that executes a fully connected neural network and a convolutional neural network.

Suppose that the NNA executes a fully connected neural network comprising an input layer, three hidden layers (hidden layer 1, hidden layer 2, and hidden layer 3), and an output layer. Suppose also that each hidden layer has the same number of nodes, that hidden layer 2 accepts 400 input activations from hidden layer 1 and generates 400 output activations for input to hidden layer 3, and that the activations are 1-byte in length. The hidden layer 2 would therefore require 400 bytes of input activation buffer memory, 400 bytes of output activation buffer memory, and 400*400=160,000 bytes of weight buffer memory. From this example, it can be seen that fully connected neural networks tend to require a greater amount of weight memory compared to activation memory. A configuration analogous to Config 0 or Config 1 in Table 1 above can therefore be determined for use with a fully connected neural network. In this example, the 400 bytes of input activation buffer memory and the 400 bytes of output activation buffer memory could be provided by an activation buffer and an output buffer (e.g., 400 bytes in Act Buf 0 and 400 bytes in Out Buf 0). Depending on the memory requirements of the other layers (e.g., hidden layer 1 and hidden layer 3), additional activation and/or output buffer memory could be provided (e.g., similar to Config 1, where there are two activation buffers and two output buffers).

As another example, suppose that the NNA executes a CNN comprising a convolutional layer that performs convolutions on three-dimensional data comprising k number of two-dimensional input maps $A_{xyk}$, where each input map is an x by y matrix. The CNN generates j number of output maps $B_{xyj}$, where each output map is also an x by y matrix, by multiplying kernel elements from a set of two-dimensional weight matrices $K_{uvkj}$ (each weight matrix being of size u by v) with corresponding elements of the input map, as summarized in the following pseudocode:

For all output map j
    For each input map k
        For each pixel x, y
            For each kernel element u, v $B_{xyj} \mathrel{+}= A_{(x-u)(y-v)k} * K_{uvkj}$ Assuming that x=128, y=128, k=32, u=3, v=3, and j=64, then the approximate buffer sizes for this CNN would be: input activation buffer=128*128*32=524,288 bytes, output activation buffer=128*128*64=1,048,576 bytes, and weight buffer=3*3*32*64=18,432 bytes. From this example, it can be seen that a larger amount of activation buffer memory and a smaller amount of weight buffer memory are required to optimally implement convolutional neural networks in comparison to fully connected neural networks.

Example Memory Buffer Implementation

Tables 2-5 describe an example implementation of the local memory buffers 140, which serve the DME 150, the activation buffer access unit 120, the weight buffer access unit 122, and the output buffer access unit 130 in a conflict-free manner. In this example, the local memory buffers 140 are implemented using SRAM, but other types of memory, both volatile and non-volatile, can be used. Additionally, the configurations in Tables 2-5 are designed for a neural network with eight dot product lanes and eight inputs, but can be scaled for other combinations (different sizes of M and N in FIG. 2).

TABLE 2

| | Sram Size | | | | |
|---|---|---|---|---|---|
| | Full-Size-4 KB (512 × 64) | | | Half-Size-2 KB (256 × 64) | |
| Sram# | 0 | 1 | 2...5 | 6...9 | 0...7 | 8...15 |
|---|---|---|---|---|---|---|
| Config0 | Out0 (4 KB) | Act0 (4 KB) | Syn1 (32 KB) | | Syn0 (32 KB) | |
| Config1 | Out0 (4 KB) | Out1 (4 KB) | Act0 (16 KB) | Act1 (16 KB) | Syn0 (32 KB) | |
| Config2 | Out0 (4 KB) | Out1 (4 KB) | Act0 (16 KB) | Act1 (16 KB) | Syn0 (16 KB) | Syn1 (16 KB) |

Table 2 above shows three possible memory buffer configurations. In Table 2, the local memory buffers are implemented using SRAMs of two sizes: 4 kilobytes (KB) and 2 KB, which correspond to full-size SRAM (Fsram) and half-size SRAM (Hsram) arrays. Half-size arrays provide flexibility as to the memory buffer design. In particular, Hsram arrays are useful for configurations where less than an Fsram size is needed. For example, as shown in Tables 4 and 5, Hsrams can be used to generate a wide range of weight buffer sizes while using only Fsrams for the activation and output buffers. For configurations where full-size arrays are needed, two Hsram arrays can be combined to generate one bank. The most significant bit of the address would distinguish which of the two half-sized SRAMs would be accessed in those cases.

The inputs and outputs of the memory arrays can be multiplexed based on the memory buffer configuration, which is programmable in the CDPR register (see the section below on setting the memory buffer configuration). Read and write addresses are interpreted according to the active memory configuration, by looking at the address bits and destination memory to generate the corresponding SRAM read or write enable. Data is also routed to the destination memory based on the local memory buffer configurations.

In Table 2, the first configuration has one 4 KB output buffer memory (Out0), one 4 KB activation buffer memory (Act0), and two weight memories (Synb0 and Synb1), each weight memory comprising eight 4 KB banks for a total of 32 KB. As shown in Tables 3-5 below, each of the Synb1 banks can be a 4 KB Fsram, whereas each of Synb0 may comprise two 2 KB Hsrams.

Tables 3-5 list the full-size and half-size memory arrays and show, for each configuration in Table 2, what type of memory buffer the arrays are configured to be used as. The notation "Syn1,4" refers to Syn1 bank 4 and "Syn0,5,1" refers to the upper half of Syn0 bank 5. For instance, in Table 3, Fsram [0] is always used as output memory, whereas Fsram [1] can be configured to be used as Act0 in the first memory configuration and as Out1 (a second output buffer) in the second and third memory configurations. As another example, shown in Table 5, Hsram [14] is configured to be the lower part of the Synb0, bank7 (Syn0,7,0) in the first and second configurations and as Syn1 bank6 (Syn1,6) in the third configuration.

TABLE 3

| | 10 Full-Size (4 KB) memories | | | | | | | | | |
|---|---|---|---|---|---|---|---|---|---|---|
| FSram# | 0 | 1 | 2 | 3 | 4 | 5 | 6 | 7 | 8 | 9 |
| Config0 | Out0 | Act0 | Syn1,0 | Syn1,1 | Syn1,2 | Syn1,3 | Syn1,4 | Syn1,5 | Syn1,6 | Syn1,7 |
| Config1 | Out0 | Out1 | Act0 | Act0 | Act0 | Act0 | Act1 | Act1 | Act1 | Act1 |
| Config2 | Out0 | Out1 | Act0 | Act0 | Act0 | Act0 | Act1 | Act1 | Act1 | Act1 |

TABLE 4

| | 16 Half-Size (2 KB) memories | | | | | | | |
|---|---|---|---|---|---|---|---|---|
| HSram# | 0 | 1 | 2 | 3 | 4 | 5 | 6 | 7 |
| Config0 | Syn0,0,0 | Syn0,0,1 | Syn0,1,0 | Syn0,1,1 | Syn0,2,0 | Syn0,2,1 | Syn0,3,0 | Syn0,3,1 |
| Config1 | Syn0,0,0 | Syn0,0,1 | Syn0,1,0 | Syn0,1,1 | Syn0,2,0 | Syn0,2,1 | Syn0,3,0 | Syn0,3,1 |
| Config2 | Syn0,0 | Syn0,1 | Syn0,2 | Syn0,3 | Syn0,4 | Syn0,5 | Syn0,6 | Syn0,7 |

TABLE 5

| HSram# | 8 | 9 | 10 | 11 | 12 | 13 | 14 | 15 |
|---|---|---|---|---|---|---|---|---|
| Config0 | Syn0,4,0 | Syn0,4,1 | Syn0,5,0 | Syn0,5,1 | Syn0,6,0 | Syn0,6,1 | Syn0,7,0 | Syn0,7,1 |
| Config1 | Syn0,4,0 | Syn0,4,1 | Syn0,5,0 | Syn0,5,1 | Syn0,6,0 | Syn0,6,1 | Syn0,7,0 | Syn0,7,1 |
| Config2 | Syn1,0 | Syn1,1 | Syn1,2 | Syn1,3 | Syn1,4 | Syn 1,5 | Syn1,6 | Syn1,7 |

Setting the Memory Buffer Configuration

In certain embodiments, the instruction set used by the NNA 100 includes a SETR instruction used to specify the memory configuration for the local memory buffers 140 by writing to a context configuration register (e.g., the context configuration register 422 in FIG. 4). The memory buffer configuration can be specified in other ways. For example, when a context is loaded for execution on the NNA 100, the host processor may program the context configuration register to specify a particular memory buffer configuration through device driver code. SETR enables the memory configuration to be changed through the program code itself. For example, the program code may include code for multiple contexts, with a different SETR instruction for specifying the memory buffer configuration to use for each context. In this manner, the program code can change the memory buffer configuration once the current context is finished executing, in preparation for executing the next context. Additionally, the program code may, in some instances, change the memory buffer configuration mid-context. For example, a context may comprise program code for a neural network that includes a convolutional layer followed by a fully connected layer, in which case the program code could include a SETR instruction for, after executing the convolutional layer using a first memory buffer configuration, switching to a different configuration in preparation for executing the fully connected layer. Thus, a neural network executed by the NNA 100 may comprise layers that perform different types of neural network operations (e.g., convolution, pooling, and general matrix multiplication).

Although the example memory buffer configurations have been described as being optimized for certain types of neural networks, the NNA 100 can also be switched between memory buffer configurations based on desired power consumption. For example, the host processor may instruct the NNA 100 to switch from a higher power mode to a lower power mode, where the lower power mode uses a smaller amount of activation, weight, and/or output buffer memory. In the lower power mode, the reduction in buffer size can be accompanied by deactivating a certain number of memory banks so that less than all of the memory banks are allocated. Each type of buffer can be reduced in size proportionally. Alternatively, the type of buffer that is least needed for the neural network or neural network layer currently being executed can be reduced without reducing the size of other types of buffers.

SETR

SETR sets a CDPR (e.g., one of the CDPRs 420 in FIG. 4) to an immediate value. SETR has the following fields:

setr <rindex>, <rvalue>

| 63 | 62 | 61 | 60 | 59 | 58 | 57 | 56 | 55 | 54 | 53 | 52 | 51 | 50 | 49 | 48 |
|---|---|---|---|---|---|---|---|---|---|---|---|---|---|---|---|
| | | | | | | | rvalue | | | | | | | | |

| 47 | 46 | 45 | 44 | 43 | 42 | 41 | 40 | 39 | 38 | 37 | 36 | 35 | 34 | 33 | 32 |
|---|---|---|---|---|---|---|---|---|---|---|---|---|---|---|---|
| | | | | | | | rvalue | | | | | | | | |

| 31 | 30 | 29 | 28 | 27 | 26 | 25 | 24 | 23 | 22 | 21 | 20 | 19 | 18 | 17 | 16 |
|---|---|---|---|---|---|---|---|---|---|---|---|---|---|---|---|
| 15 | 14 | 13 | 12 | 11 | 10 | 9 | 8 | 7 | 6 | 5 | 4 | 3 | 2 | 1 | 0 |
| | | | | | | | rindex | | 10 | | | | 0010 | | |

| Field | Description |
|---|---|
| rindex | Index of CDPR Register |
| rvalue | 32-bit immediate value to written to the register |

When the register index "rindex" is set to 0, rvalue [3:0] is used to identify a field in the context configuration register to update. The rest of the values in the context configuration register are unchanged. An appropriate number of bits are used from rvalue [31:4] to update the field. As shown in the table below, SETR can be used to set the contents of the context configuration register to specify various parameters such as input scale factor, local memory buffer configurations, and interrupt enable. When rvalue is set to 5, SETR writes to the bits 22 and 23 of the context configuration register, which correspond to a 2-bit field indicating which memory buffer configuration to use. For example "SETR 5, 1" would select configuration 1 by writing a value of 1 to the 2-bit field of the context configuration register.

| Rvalue[3:0] | Bit # | Context Configuration Field Description |
|---|---|---|
| 6 | 27:24 | Input Scale Factor |
| 5 | 23:22 | MBC-Memory Buffers Configuration |
| 4 | 21:8 | NI-Number of Instructions |
| 3 | 4:3 | IL-Interrupt pulse length |
| 2 | 2:2 | RP: Reset Performance Counters |
| 1 | 1:1 | IE: Interrupt Enable |
| 0 | 0:0 | LI: Load NNA Context Instructions from System Memory |

Example Memory Buffer Configuration Process and Computing System

Figure 6:
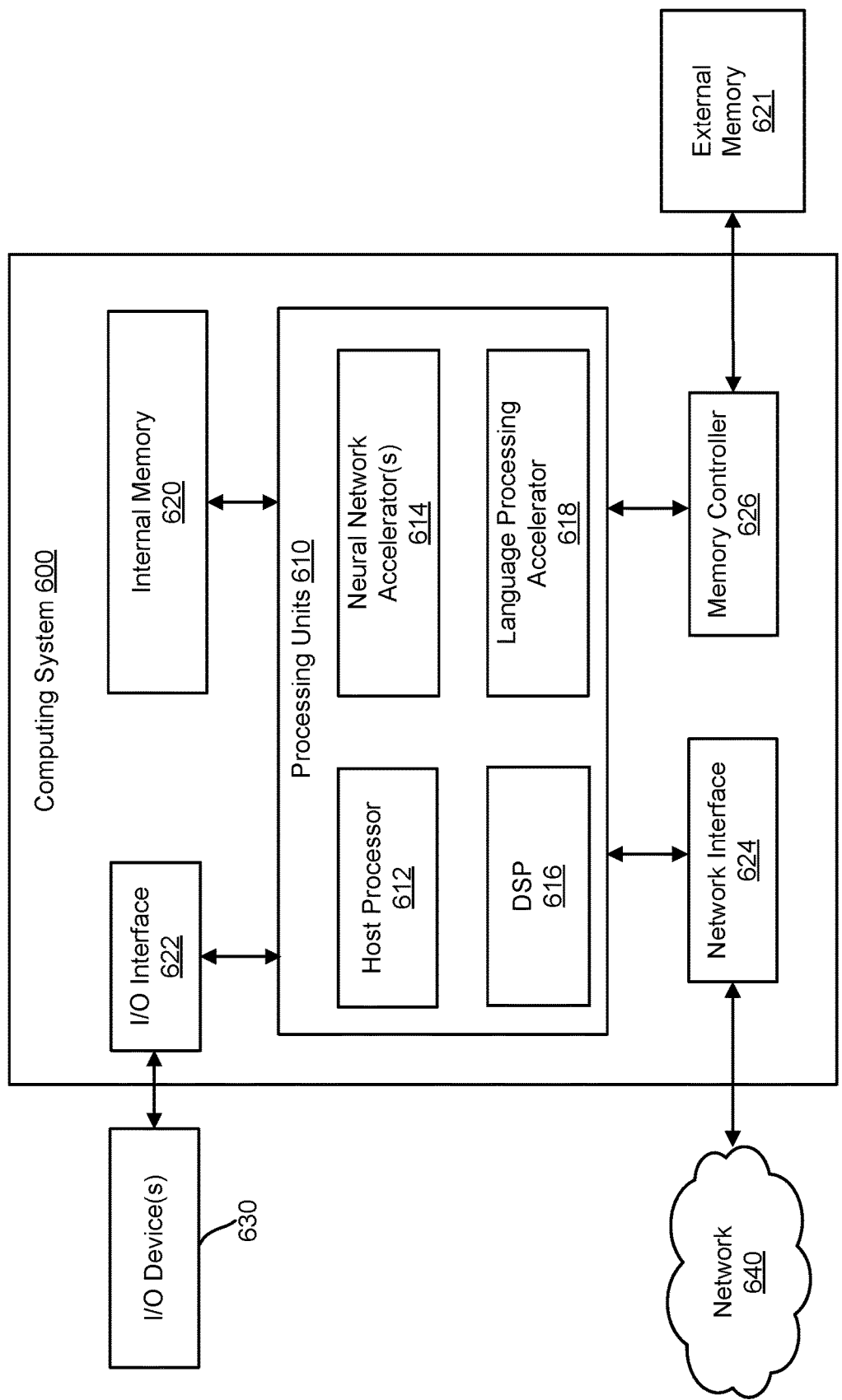
FIG. 6 illustrates an example of a computing system, which can be implemented as a system-on-chip, in which the neural network accelerator of FIG. 1 can be used.

FIG. 6 is a simplified block diagram of an example computing system 600 in which the NNA 100 of FIG. 1 can be used. In some examples, the computing system 600 can be used to implement a special purpose computing system for executing neural networks in connection with specific types of applications. For example, the computing system 600 may implement a computing device that processes speech input through NNA 100 to provide an intelligent virtual assistant that performs various tasks on behalf of a user, such as home automation, playing audio or visual media, and placing online orders for products or services. Alternatively, the computing system 600 can be used to implement a general purpose computer that also has neural network capabilities. In certain embodiments, the computing system 600 is implemented as a system-on-chip (SoC).

The example computing system 600 of FIG. 6 includes a set of processing units 610, an internal memory 620, an external memory 621, an Input/Output (I/O) interface 622, and a network interface 624. The processing units 610 can include a host processor 612, an NNA 614, a digital signal processor (DSP) 616, a language processing accelerator 618, and a memory controller 626. The computing system 600 can further include one or more busses (not depicted) that enable the various components of the computing system 600 to communicate with one another. In various implementations, the computing system 600 can include other hardware that is not illustrated here.

The host processor 612 can be a general purpose integrated circuit that is capable of executing program instructions. In some examples, the host processor 612 can include multiple processing cores. In a multi-core processor, each core may be able to independently execute program code. As part of executing its own program code, the host processor 612 may generate program code (e.g., an NNA context) for execution on NNA 614. For example, host processor 612 may execute a software compiler stored in the internal memory 620 or the external memory 621 to produce compiled program code and device driver code for transmission to NNA 614. In certain embodiments, the computing system 600 can include more than one host processor 612, each host processor being capable of acting as the host for NNA 614.

The NNA 614 can be implemented using the NNA 100 in FIG. 1 and is configured to execute contexts on behalf of the host processor 612. The processing units 610 can include multiple NNAs 614 configurable to run contexts simultaneously, e.g., contexts for different portions of the same neural network or for different neural networks.

The DSP 616 can perform digital signal processing to prepare data for processing by other processing units such as the NNA 614 or the language processing accelerator 618. In some embodiments, the DSP 616 may condition and convert analog audio signals into digital data, where the audio signals are generated by one or more microphones included in I/O devices 630.

The language processing accelerator 618 can perform language processing including, for example, speech recognition. In certain embodiments, the language processing accelerator 618 implements a Weighted Finite-State transducers (WFST) based language model for speech recognition. The language processing accelerator 618 can work in conjunction with the NNA 614 and the DSP 616 to perform language processing. For example, an audio frame from a microphone may be processed by DSP 616 to extract audio features (e.g., using a Fast Fourier Transform or other signal analysis techniques) in the form of a feature vector for input to an acoustic model. The acoustic model may be implemented by a neural network executed within the NNA 614, and may infer the probability that the audio frame corresponds to particular words or parts of speech (e.g., one or more phonemes). The probabilities computed by the acoustic model can then be input to the language processing accelerator 618 to decode the audio frame into text.

The internal memory 620 and the external memory 621 collectively form the system memory of the computing system 600. The system memory can include memory used for storage of program code executed by the host processor 612, the NNA 614, and/or any of the other processing units 610. For example, the system memory can include an operating system, software applications executed by the host processor 612 within an environment provided by the operating system, device driver code (e.g., for configuring an NNA context, selecting a memory buffer configuration, or for controlling the I/O devices 630), program code for an NNA context, storage space for data being operated on or produced by the host processor 612, storage space for activations and weights for loading into the NNA 614, storage space for results computed by NNA 614, and storage space for data being operated on or produced by the language processing accelerator 618. The operating system within the system memory can coordinate the activities of the hardware of the computing system 600, as well as the activities of any software applications or device drivers. For example, the operating system can perform operations such as scheduling NNA contexts, executing applications, or controlling peripheral devices (e.g., the I/O devices 630). The system memory can be implemented using volatile memory types (such as Random Access Memory (RAM) type memories) and/or non-volatile memory types (such as Read-Only Memory (ROM), flash memory, etc.).

The above described data of the system memory can be distributed between the internal memory 620 and the external memory 621 in any fashion. For example, the internal memory 620 may store the operating system, device driver code, program code for an NNA context, and software applications, while the external memory 621 stores activations, weights, and results computed by the NNA 614. In some embodiments, both the internal memory 620 and the external memory 621 may store data used by the NNA 614.

The memory controller 626 is configured to transfer data between the external memory 621 and the processing units 610. For example, if the data coming into the DME 150 of FIG. 1 is provided by the external memory 621, the memory controller 626 may read the data out of the external memory 621 and into the DME 150. In certain embodiments, the external memory 621 is implemented as Dynamic Random Access Memory (DRAM), and the memory controller 626 is a DRAM controller. However, the external memory 621 can be implemented with other types of memory besides DRAM, e.g., flash memory, SRAM, etc.

The I/O devices 630 can include hardware that adds functionality to the computing system 600. For example, the I/O devices 638 can include non-volatile storage devices, such as solid state drives, magnetic drives, optical drives, and/or tape drives, among other examples. The I/O devices 630 can further include devices for receiving input from or providing output to a user, such as keyboards, display monitors, audio speakers, and microphones.

The network interface 624 can enable the computing system 600 to communicate with a network 640 or with multiple networks. The network interface 624 can include, for example, one or more network interface cards (NICs). The network interface 624 can include a physical port for connecting to a wired network. Alternatively or additionally, the network interface 624 can include an antenna for connecting to a wireless network. In some examples, the network interface 624 includes more than one physical port, and/or more than one antenna, so that the computing system 600 can communicate with multiple networks at the same time.

The system memory (internal memory 620 and external memory 621), storage devices, and other memories discussed above are examples of computer-readable media. Other examples of computer-readable media include removable storage devices, such as magnetic tapes, floppy disks, Compact Discs (CDs), Digital Versatile Discs (DVDs), Blue-Ray disks, and flash memory drives, among other examples. In each of these examples, the computer-readable medium is capable of storing program code that can be executed by one or more of the processing units 610. In some cases, the computer-readable medium may be non-transitory, meaning that the data stored on the computer-readable medium remains stored on the medium when power is not applied to the computer readable medium. Examples of non-transitory computer-readable media include ROM-based memory, hard disks, removable disks such as those listed above, and flash-based memory, among other examples.

Figure 7:
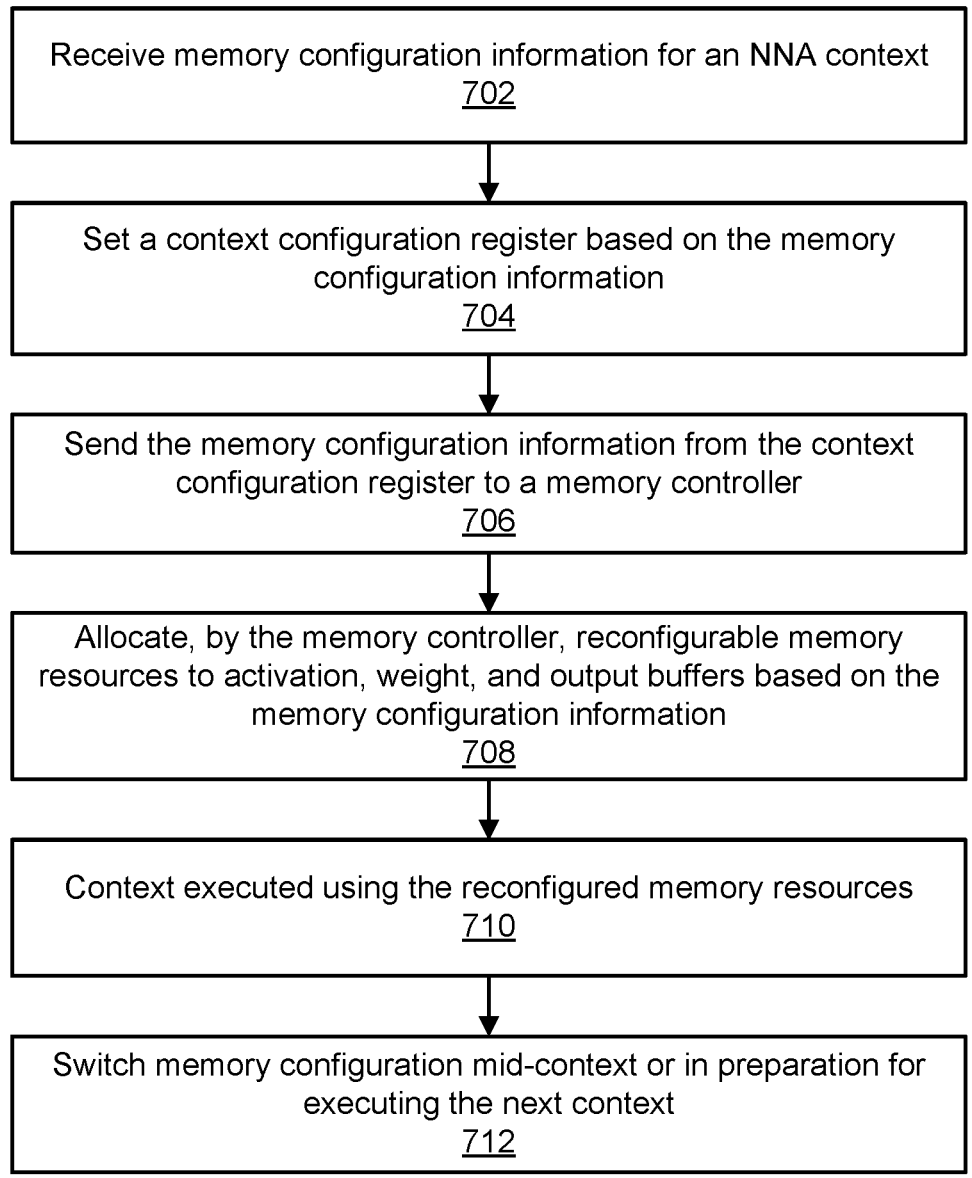
FIG. 7 illustrates an example process for configuring memory resources, according to certain embodiments.

FIG. 7 is a flow diagram of an example process 700 for configuring memory resources, according to certain embodiments. The process 700 can be performed by the NNA 100 in FIG. 1. At block 702, memory configuration information is received for an NNA context to be executed. The memory configuration information may be received from the host processor or using the SETR instruction described above, and indicates a particular memory buffer configuration to use for the context to be executed. The memory buffer configuration is selected from a set of predefined memory buffer configurations and corresponds to the configuration which optimizes throughput for the context to be executed. For example, if the context comprises instructions for a layer of a convolutional neural network, the memory configuration information may select the memory buffer configuration 510 in FIG. 5A, since the configuration 510 is the best suited among the available configurations in FIGS. 5A-5C for convolution neural networks.

At block 704, a context configuration register (e.g., context configuration register 422) is set based on the memory configuration information received in block 702. As mentioned earlier, the context configuration register can include a field whose value indicates which memory buffer configuration from among the set of predefined memory buffer configurations will be used for the context.

At block 706, the memory configuration information is sent from the context configuration register to a buffer memory manager (e.g., buffer memory manager 300). In embodiments where the buffer memory manager is implemented using multiplexers, the memory configuration information can be input directly to the multiplexers as a selection signal.

At block 708, the buffer memory manager allocates reconfigurable memory resources (e.g., a set of SRAM banks) to activation, weight, and output buffers based on the memory configuration information. As discussed in connection with example of FIG. 3, the allocation of memory resources can be implemented by routing input to and output from the memory resources without necessarily physically reconfiguring the memory devices. For example, a request to access an activation buffer can reference an address within an address space of the activation buffer, which address is then mapped to an address of a memory location in one of the memory resources by virtue of the routing.

At block 710, the context is executed using the reconfigured memory resources. The execution of the context may involve loading activations and weights into the activation and weight buffers from system memory, performing various computations (e.g., by the control sequencer 112 and/or the NPUs 124, 126, and 128) using the activations and weights stored in the activation and weight buffers, writing results of the computations to one or more output buffers, and storing the results contained in the output buffers into the system memory.

At block 712, the configuration of the memory buffers is switched, either mid-context or in preparation for executing the next context. As explained earlier, the memory buffer configuration can be switched after a context has finished executing, in order to change to a memory buffer configuration that is appropriate for the next context to be executed. For example, the context executed at block 710 may execute a convolutional layer, and the next context could execute a fully connected layer. Switching of memory buffer configurations between contexts can be performed by the host processor in most instances. Alternatively, as described in connection with the SETR instruction above, the program code could switch memory buffer configurations, e.g., when the context executed at 710 comprises program code implementing a convolutional neural network comprising both a fully connected layer and a convolutional layer.

Although specific embodiments have been described, various modifications, alterations, alternative constructions, and equivalents are possible. Various features and aspects of the above-described embodiments may be used individually or jointly. The specification and drawings are, accordingly, to be regarded in an illustrative rather than a restrictive sense. It will, however, be evident that various modifications and changes may be made thereunto without departing from the broader spirit and scope of the disclosure as set forth in the claims. Further, while certain embodiments have been described using a particular combination of hardware and software, it should be recognized that other combinations of hardware and software are also possible.

The use of the terms "a" and "an" and "the" and similar referents in the context of describing the disclosed examples (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate examples of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain examples require at least one of X, at least one of Y, or at least one of Z to each be present.

Various embodiments of this disclosure are described herein. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A computing system, comprising:
   at least one processing unit that executes program code implementing a first neural network layer and program code implementing a second neural network layer, wherein the first neural network layer is a convolutional layer, and wherein the second neural network layer is a fully connected layer;
   a plurality of memory banks; and
   a memory manager configured to allocate the plurality of memory banks according to a first configuration and a second configuration, the first configuration and the second configuration each including an activation buffer that is dedicated to storing values representing input activations produced by an activation function of a neural network, a weight buffer that is dedicated to storing weights of the neural network, and an output buffer that is dedicated to storing values representing output activations of the neural network, each output activation being a result of a computation involving the input activations and the weights,
   wherein in the first configuration, the memory manager allocates different numbers of memory banks to the activation buffer, the weight buffer, and the output buffer than in the second configuration resulting in a different size activation buffer, a different size weight buffer, and a different size output buffer in the first configuration compared to the second configuration, wherein at least some of the memory banks change from being allocated to the activation buffer to being allocated to the weight buffer upon switching from the first configuration to the second configuration, wherein the first configuration is used during execution of the program code implementing the first neural network layer, and wherein the second configuration is used during execution of the program code implementing the second neural network layer.

2. The computing system of claim 1, wherein the at least one processing unit executes the program code implementing the second neural network layer after executing the program code implementing the first neural network layer, and wherein the memory manager switches from the first configuration to the second configuration based on execution, by the at least one processing unit, of an instruction in the program code implementing the first neural network layer, the instruction setting a configuration register in the computing system to a value that represents the second configuration.

3. The computing system of claim 1, further comprising:
   an activation buffer access unit that accesses the activation buffer in the first configuration and the second configuration;
   an output buffer access unit that accesses the output buffer in the first configuration and in the second configuration; and
   a weight buffer access unit that accesses the weight buffer in the first configuration and in the second configuration,
   wherein each memory bank from the plurality of memory banks has a set of physical addresses, wherein the set of physical addresses is hidden, by the memory manager, from the activation buffer access unit, the output buffer access unit, and the weight buffer unit, and wherein in both the first configuration and the second configuration, the memory manager restricts access by the activation buffer access unit to memory banks that are from the plurality of memory banks and allocated to the activation buffer, restricts access by the output buffer access unit to memory banks that are from the plurality of memory banks and allocated to the output buffer, and restricts access by the weight buffer access unit to memory banks that are from the plurality of memory banks and allocated to the weight buffer.

4. A computing system, comprising:
   memory resources that are reconfigurable by allocating the memory resources among at least one activation buffer storing data representing input activations produced by an activation function of a neural network, at least one weight buffer storing data representing weights of the neural network, and at least one output buffer storing data representing output activations of the neural network;
   a memory manager configured to allocate the memory resources according to a first configuration and a second configuration, wherein in comparison to the second configuration, the first configuration has a different number of activation buffers, a different number of weight buffers, a different number of output buffers, a different size activation buffer, a different size weight buffer, and a different size output buffer, wherein at least one memory bank of the memory resources changes from being allocated to the weight buffers to being allocated to the activation buffers upon switching from the first configuration to the second configuration; and
   at least one processing unit that executes a first set of program code for the neural network after the memory manager has allocated the memory resources according to the first configuration, and executes a second set of program code for the neural network after the memory manager has allocated the memory resources according to the second configuration, wherein the first set of program code implements a first neural network layer, wherein the second set of program code implements a second neural network layer, and wherein the first neural network layer performs a different type of neural network operation than the second neural network layer.

5. The computing system of claim 4, wherein the first set of program code is executed while the computing system is operating in a first power mode, wherein the second set of program code is executed while the computing system is operating in a second power mode, and wherein a portion of the memory resources is deactivated in the second configuration.

6. The computing system of claim 4, wherein the first configuration has more weight buffers than activation buffers or output buffers.

7. The computing system of claim 6, wherein the first configuration includes a first weight buffer and a second weight buffer, and wherein the first set of program code comprises instructions that cause a first set of weights to be written into the first weight buffer in parallel with reading of a second set of weights out of the second weight buffer.

8. The computing system of claim 6, wherein the second configuration has more activation buffers than weight buffers and more output buffers than weight buffers, and wherein the second configuration has a higher amount of activation buffer memory than the first configuration.

9. The computing system of claim 6, wherein in the second configuration, the number of activation buffers is the same as the number of output buffers and the number of weight buffers, and wherein the second configuration has a lower amount of weight buffer memory than the first configuration.

10. The computing system of claim 4, wherein the memory manager switches from the first configuration to the second configuration based on execution, by the at least one processing unit, of an instruction in the first set of program code, the instruction setting a configuration register in the computing system to a value that represents the second configuration.

11. The computing system of claim 4, wherein the memory resources comprise at least one memory bank having physical addresses that are hidden by the memory manager.

12. The computing system of claim 4, wherein the memory resources comprise memory arrays of a first size and memory arrays of a second size that is smaller than the first size, and wherein at least one weight buffer in the first configuration or the second configuration corresponds to a combination of the memory arrays of the second size.

13. The computing system of claim 4, wherein the first configuration has a lower amount of weight buffer memory than the second configuration, and wherein the executing of the first set of program code by the at least one processing unit comprises reusing a same set of weights to generate a first output activation and a second output activation, the generating of the first output activation comprising computing a convolution between the set of weights and a first set of inputs to the neural network, and the generating of the second output activation comprising computing a convolution between the set of weights and a second set of inputs to the neural network.

14. A method, comprising:
receiving, by a neural network accelerator, configuration information indicating a first configuration for memory resources of the neural network accelerator, wherein the memory resources are reconfigurable by allocating the memory resources among at least one activation buffer storing data representing input activations produced by an activation function of a neural network, at least one weight buffer storing data representing weights of the neural network, and at least one output buffer storing data representing output activations of the neural network;
allocating, by a memory manager of the neural network accelerator and based on the receiving of the configuration information indicating the first configuration, the memory resources according to the first configuration;
executing, by at least one processing unit of the neural network accelerator, a first set of program code after the memory resources have been allocated according to the first configuration, wherein the first set of program code implements a first neural network layer;
receiving, by the neural network accelerator, configuration information indicating a second configuration for the memory resources;
allocating, by the memory manager, the memory resources according to the second configuration and after the first set of program code has finished executing, wherein in comparison to the second configuration, the first configuration has a different number of activation buffers, a different number of weight buffers, a different number of output buffers, a different size activation buffer, a different size weight buffer, and a different size output buffer, wherein at least one memory bank of the memory resources changes from being allocated to the weight buffers to being allocated to the activation buffers; and
executing, by the at least one processing unit, a second set of program code after the memory resources have been allocated according to the second configuration, wherein the second set of program code implements a second neural network layer, and wherein the first neural network layer performs a different type of neural network operation than the second neural network layer.

15. The method of claim 14, wherein the first configuration has more weight buffers than activation buffers or output buffers.

16. The method of claim 15, wherein the first configuration includes a first weight buffer and a second weight buffer, and wherein the first set of program code comprises instructions that cause a first set of weights to be written into the first weight buffer in parallel with reading of a second set of weights out of the second weight buffer.

17. The method of claim 15, wherein the second configuration has more activation buffers than weight buffers and more output buffers than weight buffers, and wherein the second configuration has a higher amount of activation buffer memory than the first configuration.

18. The method of claim 15, wherein in the second configuration, the number of activation buffers is the same as the number of output buffers and the number of weight buffers, and wherein the second configuration has a lower amount of weight buffer memory than the first configuration.

19. The method of claim 14, further comprising:
switching, by the memory manager, from the first configuration to the second configuration based on execution, by the at least one processing unit, of an instruction in the first set of program code, the instruction setting a configuration register in the neural network accelerator to a value that represents the second configuration.

20. The method of claim 14, wherein the executing, by the at least one processing unit, of the first set of program code comprises:
while the memory resources are allocated according to the first configuration:
receiving a set of activations from a first activation buffer and a set of weights from a first weight buffer;
generating a first output activation using the set of activations and the set of weights; and
storing the first output activation in a first output buffer, wherein the first output activation is an input activation to the second neural network layer, the method further comprising:

transferring the first output activation from the first output buffer to a second activation buffer, the second activation buffer being allocated according to the second configuration.

* * * * *